United States Patent [19]
Stock et al.

[11] Patent Number: 6,049,901
[45] Date of Patent: Apr. 11, 2000

[54] TEST SYSTEM FOR INTEGRATED CIRCUITS USING A SINGLE MEMORY FOR BOTH THE PARALLEL AND SCAN MODES OF TESTING

[76] Inventors: Mary C. Stock, 47 Winslow Rd., Reading, Mass. 01867; Raymond Strouble, 11 Holly La., Westford, Mass. 01886; Ernest P. Walker, 254 Conant Rd., Weston, Mass. 02193

[21] Appl. No.: 08/931,164

[22] Filed: Sep. 16, 1997

[51] Int. Cl.$^7$ ................................... G01R 31/28
[52] U.S. Cl. ............................. 714/726; 714/30
[58] Field of Search ............................. 371/22.31–22.33; 714/726, 30

[56] References Cited

U.S. PATENT DOCUMENTS

| | | | |
|---|---|---|---|
| 4,947,357 | 8/1990 | Stewart et al. | 371/22.31 |
| 5,260,947 | 11/1993 | Posse | 371/22.32 |
| 5,530,706 | 6/1996 | Josephson et al. | 371/22.32 |
| 5,606,568 | 2/1997 | Sudweeks | 371/22.34 |
| 5,648,973 | 7/1997 | Mote, Jr. | 714/727 |
| 5,828,824 | 10/1998 | Swoboda | 714/25 |

FOREIGN PATENT DOCUMENTS

0 160 789 A2  11/1985  European Pat. Off. .

*Primary Examiner*—Albert De Cady
*Assistant Examiner*—Shelly A Chase

[57] ABSTRACT

A semiconductor test system has a scan test mode and a parallel test mode. A single memory using substantially all of its storage space stores a) parallel test vectors for use during the parallel test mode, and b) parallel test vectors and scan test vectors for use during the scan test mode. A switch is used to change from the parallel test mode to the scan test mode. A pattern generator coupled to the single memory manipulates the parallel test vectors used during the parallel test mode and the parallel and scan test vectors used during the scan test mode. The speed of the scan test mode is increased by interleaving the memory and reading test vectors out of the memory in parallel. Processing time is further decreased by creating multiple scan chains and applying them to multiple pins of the device under test (DUT). Lastly, the clock speed of the bus feeding scan chain data to the pins of the DUT is increased by multiplexing the scan chain data being transferred to the bus.

19 Claims, 4 Drawing Sheets

TEST SYSTEM FOR INTEGRATED CIRCUITS USING A SINGLE MEMORY FOR BOTH THE PARALLEL AND SCAN MODES OF TESTING

BACKGROUND OF THE INVENTION

1. Field of the Invention

The present invention relates to an integrated circuit test system. More specifically, the invention relates to the test system having a single memory used for both a parallel testing mode and a scan testing mode.

2. Description of the Related Art

Figure 1:
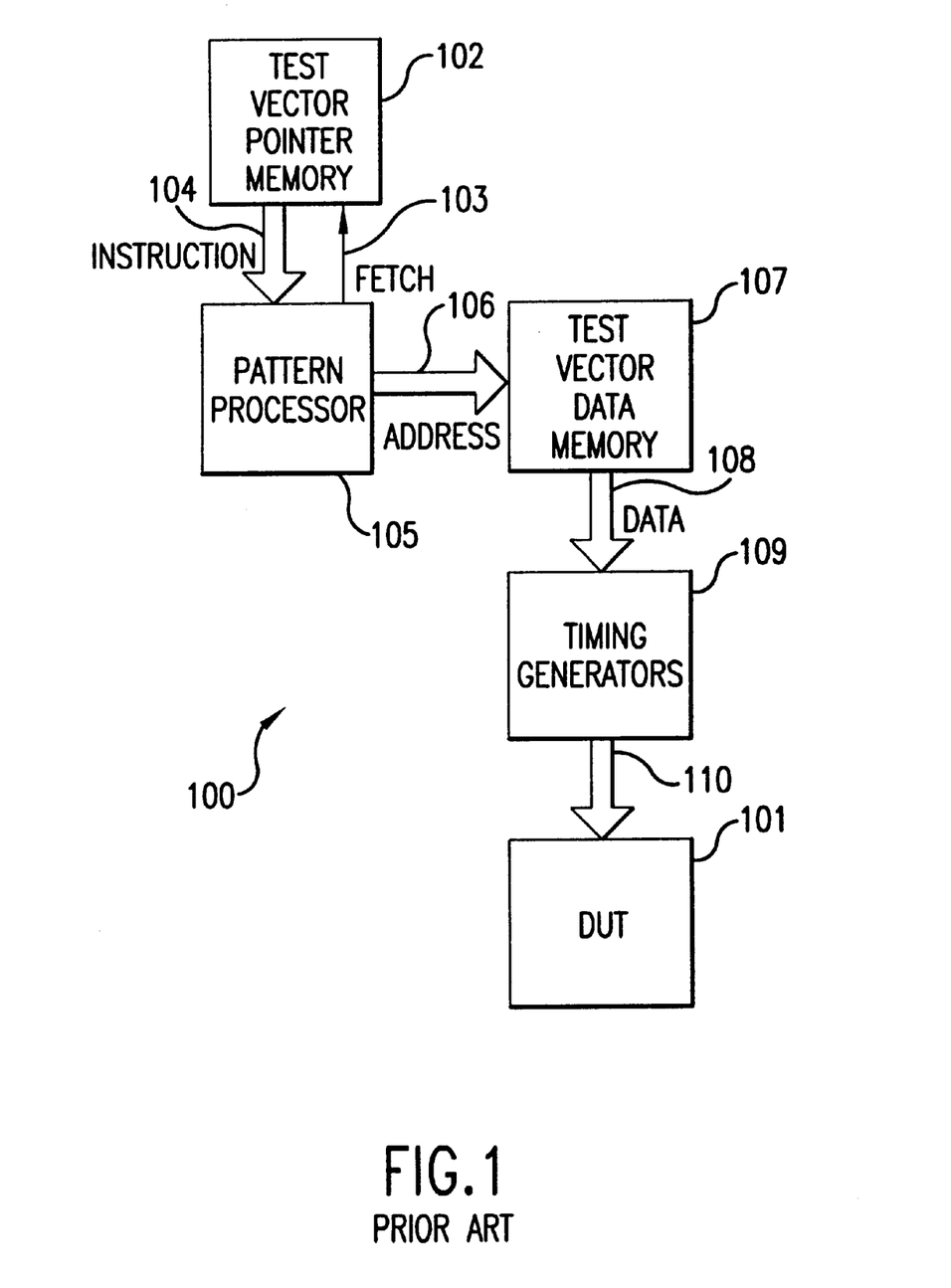
FIG. 1 depicts an integrated circuit test apparatus according to the prior art.
Figure 2:
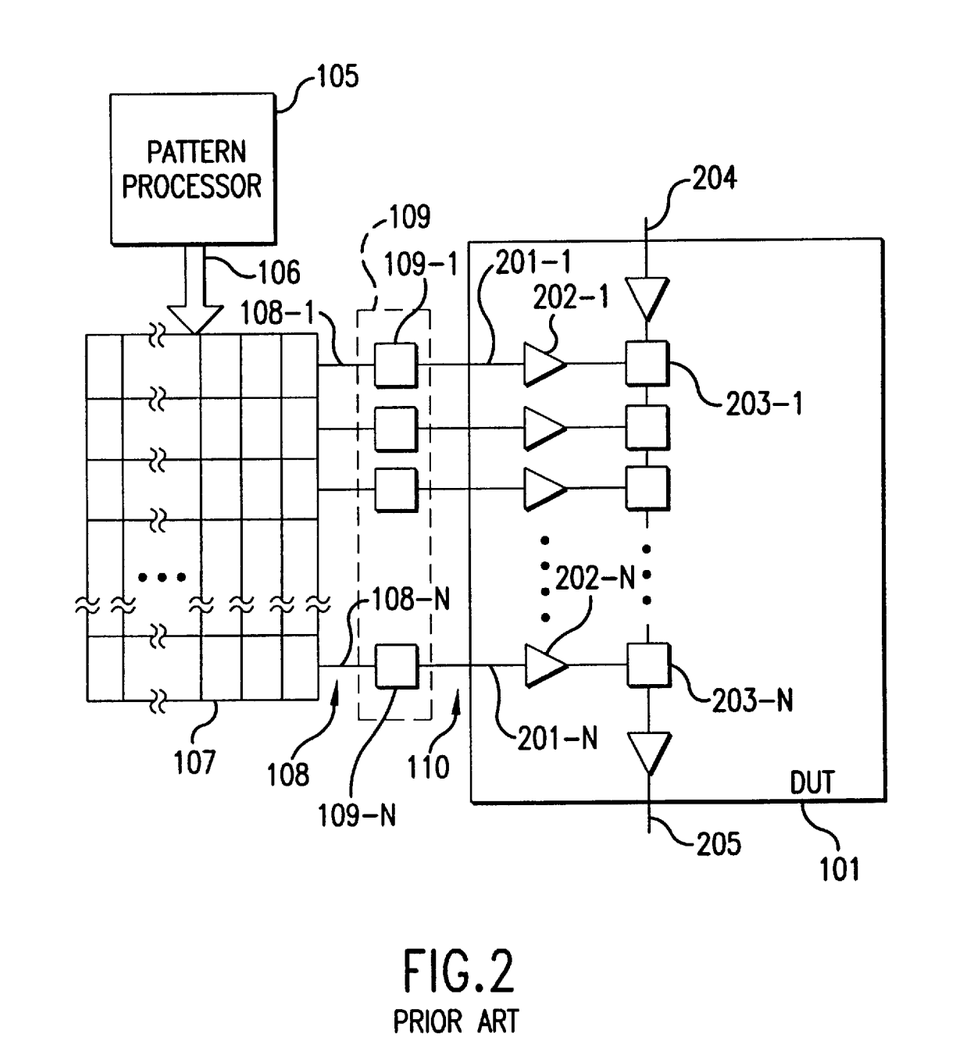
FIG. 2 depicts a pattern processor and parallel test vector memory arrangement of an integrated circuit test apparatus according to the prior art.
Figure 3:
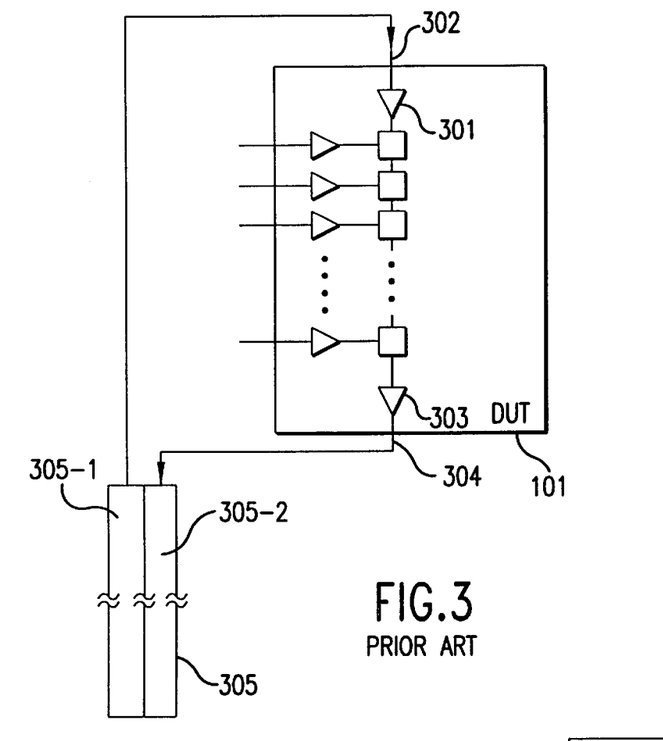
FIG. 3 depicts a serial test vector memory arrangement of an integrated circuit test apparatus according to the prior art.
Figure 4:
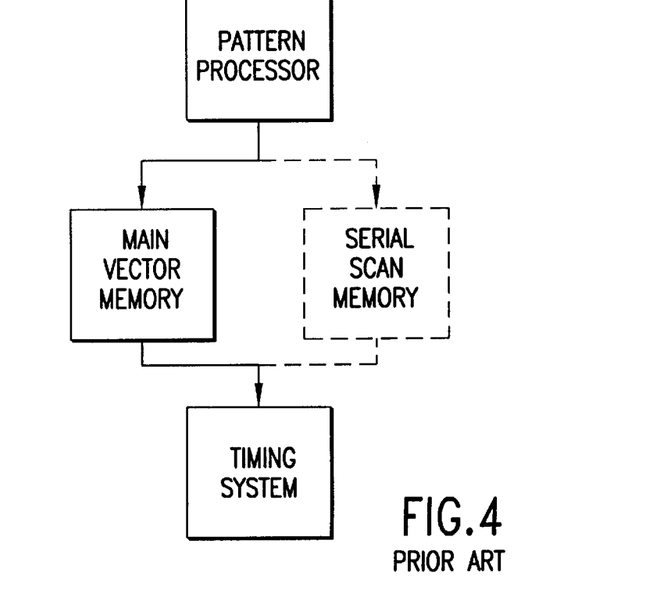
FIG. 4 depicts a support apparatus for a serial integrated circuit test apparatus according to the prior art.

The prior art in U.S. Pat. No. 5,606,568, assigned to the present assignee, shows a testing method and structure for performing level sensitive scan design (LSSD) testing of electronic circuits using parallel test vector memory. FIG. 1 shows a prior art system 100 for testing an electronic device under test (DUT) 101. Test system 100 includes test vector pointer memory 102 which stores a plurality of predefined test instructions defining the electronic tests to be performed on DUT 101. Pattern processor 105 receives, in response to a fetch signal applied to test vector pointer memory 102 via fetch line 103 an instruction via instruction bus 104 from test vector pointer memory 102. In response to the instruction, pattern processor 105 provides one or a sequence of addresses via address bus 106 to test vector data memory 107 in order to access one or more test vectors previously stored in test vector data memory 107. These one or more test vectors are sequentially sent via data bus 108 to timing generators 109 which serve to convert the test vector data into appropriately timed signals having appropriate voltage and current levels which are in turn applied via bus 110 to appropriate leads of DUT 101. Such a prior art test system as shown in FIG. 1 is well known in the art and is described, for example, in R. Powell. "IBM's VLSI Logic Test System." IEEE Test Conference Proceedings, pp.388–392 (1981). As shown in FIG. 2, during normal operation, parallel test vectors are addressed from test vector data memory 107 by pattern processor 105 and in turn applied via leads 108-1 through 108-N of bus 108 to individual timing generators and associated electronics 109-1 through 109-N which in turn apply desired signal levels to input leads 201-1 through 201-N of DUT 101.

Several types of instructions can be stored in test vector pointer memory 102 for controlling pattern processor 105. One such instruction is the test-vector-strip (TVS) instruction, which has the following format:

TVS<count><address> where TVS is the instruction type, <count> is the number of sequential vectors within test vector data memory 107 to be sequentially addressed by pattern processor 105, and <address> is the address within test vector data memory 107 containing the first one of the sequential vectors. For example, A TVS instruction TVS 15 1102 causes pattern processor 105 to sequentially address 15 vectors stored within test vector data memory 107, beginning at address 1102 and thus ending at address 1116. With the advent of large scale integrated circuits problems of device testing have been compounded. For example, as the number of components and input leads in an integrated circuit increases there are greater numbers of combinations and permutations of input data sequences and output data sequences. It becomes increasingly difficult to test all such combinations and permutations as well as consuming greater time in programming the test sequence, storing the number of test vectors, and taking increased time to test each integrated circuit. These problems add to the cost of integrated circuit testing.

In order to reduce some of these problems with testing LSI devices, integrated circuits have been designed using the level sensitive scan design (LSSD) technique as described by E. Eichelberger and T. Williams. "A Logic Design Structure for LSI Testability", Journal of Design Automation and Fault Tolerant Computing. Vol.2 No.2 pp. 165–178 (May 1978). Using this LSSD technique, DUT 101 of FIG. 2 is designed to include a plurality of gates or latches 203-1 through 203-N each associated with input lead 201-1 through 201-N of DUT 101. Input signals on input leads 201-1 through 201-N are applied to latches 203-1 through 203-N via input buffers 202-1, 202-N. The output leads of latches 203-1 through 203-N are connected to internal circuitry (not shown) of DUT 101, thereby allowing the parallel input signals applied to parallel input leads 201-1 through 201-N of DUT 101 to cause DUT 101 to operate in a normal fashion. However, in addition DUT 101 includes serial LSSD input lead 204 and serial LSSD output lead 205 having latches 203-1 through 203-N connected serially therebetween. While FIG. 2 shows only a single chain of latches 203-1 through 203-N and single pair of LSSD input and output leads such as leads 204,205, it is to be understood that DUT 101 can have any desired number of LSSD channels including latches for temporarily storing logic level at any desired locations within DUT 101. Each such LSSD channel includes a plurality of latches such as latches 203-1 through 203-N, and LSSD input and output leads 204,205, as well as an associated input buffer and output buffer. By utilizing such LSSD channels, normal parallel data input operation of DUT 101 can be suspended while the contents of such latches are preset by rippling in serial input signals from LSSD input lead 204 and sequentially reading on LSSD output lead 205 the contents of each LSSD register 203-1 through 203-N. This allows the test system the ability to preset data values at desired locations internal to DUT 101 without the need for causing such data values to be preset in response to parallel input test vectors applied to input leads 201-1, 201-N. Normal parallel input signal operation of DUT 101 is performed as previously described utilizing test vector data memory 107 which applies parallel test vectors to parallel input leads 201-1 through 201-N. However, as shown in FIG. 3 when it is desired to test DUT 101 using LSSD input and output leads 302, 304, separate serial LSSD input memory 305-1 and LSSD output memory 305-2 is used. During LSSD testing the contents of LSSD input memory 305-1, which is configured to be one bit wide per LSSD channel and typically on the order of 100 Mbits deep, are sequentially applied to LSSD input lead 302. Simultaneously, the contents of the latches in the LSSD channel are sequentially outputted on LSSD output lead 304 and compared to expected LSSD output memory 305-2 which is one bit wide per LSSD channel and typically the same depth as is LSSD input memory 305-1.

Unfortunately, this prior art technique for performing LSSD testing requires the use of additional memories 305-1, 305-2, thereby adding to cost and complexity of the test system.

U.S. Pat. No. 5,606,568 further describes a single memory used for both parallel input test vector testing and serial LSSD test vector testing of an LSSD device. The patent shows a memory having both serial scan chains and parallel vectors distributed throughout the memory with large blocks of memory that are unfilled with data. This memory was part of a system used to decrease the time needed to reload the memory. This memory has the disadvantage that it does not use memory space efficiently. To decrease reload time it sacrifices space efficiency.

What is needed is a test system with a single memory which will allow a tester to have both a parallel test mode and a scan test mode that is efficient in its use of space and provides both parallel and scan vectors to the test system fast enough to conduct testing on integrated circuits economically and efficiently.

SUMMARY OF THE INVENTION

A semiconductor test system has a scan test mode and a parallel test mode. A single memory using substantially all of its storage space stores a) parallel test vectors for use during the parallel test mode, and b) parallel test vectors and scan test vectors for use during the scan test mode. A switch is used to change from the parallel test mode to the scan test mode. A pattern generator coupled to the single memory manipulates the parallel test vectors used during the parallel test mode and the parallel and scan test vectors used during the scan test mode.

The speed of the scan test mode is increased by interleaving the memory and by reading test vectors out of the memory in parallel. Processing time is further decreased by creating multiple scan chains and applying them to multiple pins of the device under test (DUT). Lastly, the clock speed of the bus feeding scan chain data to the pins of the DUT is increased by multiplexing the scan chain data being transferred to the bus.

DETAILED DESCRIPTION OF THE INVENTION

Figure 5:
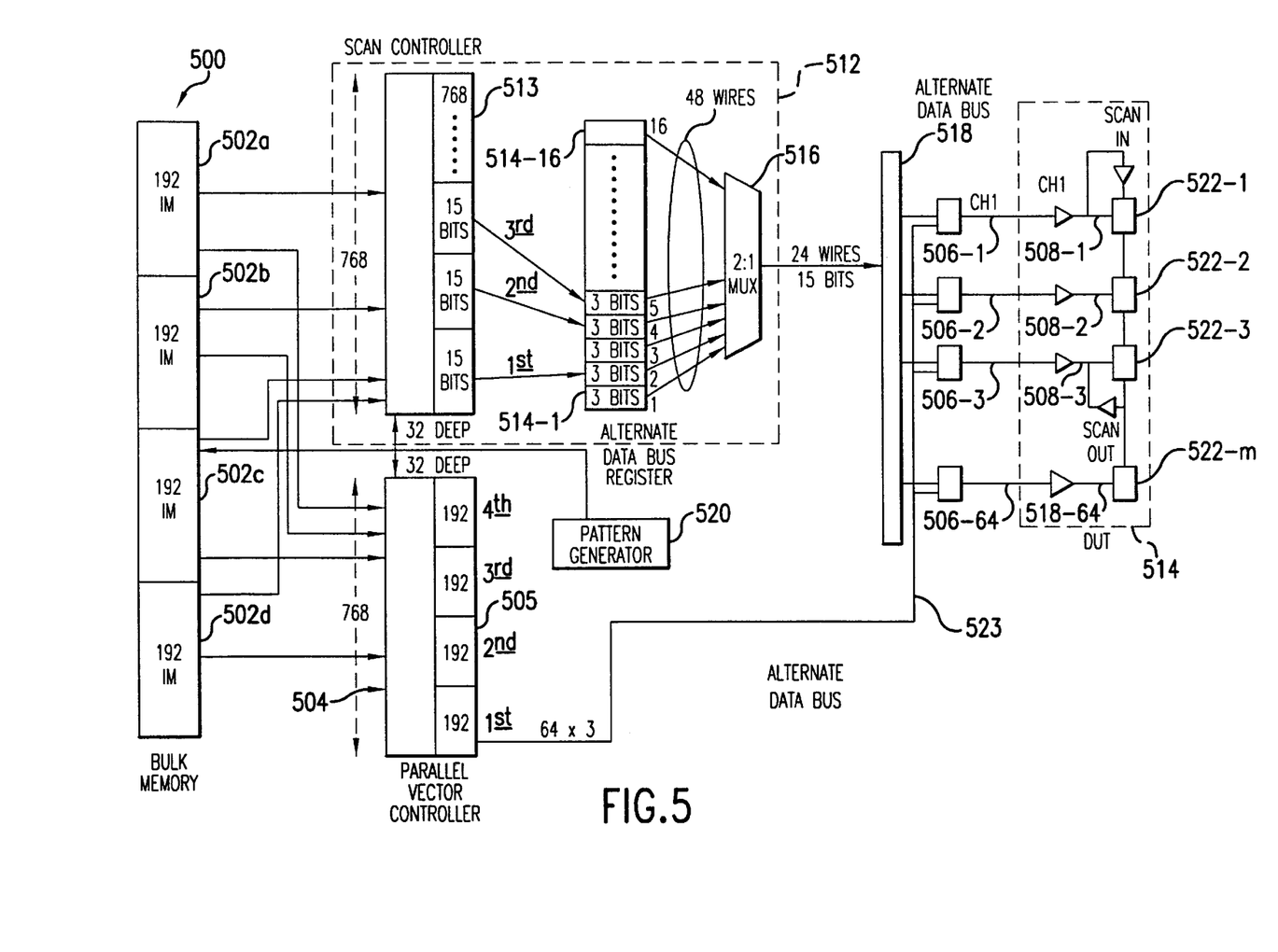
FIG. 5 is a schematic diagram of the integrated circuit test system of the invention having a parallel test mode and a scan test mode.

FIG. 5 shows a test system with a single memory used for both the parallel test mode and the scan test mode. Bulk memory 500 is packed with parallel test vectors in the parallel test mode and a mix of parallel and scan test vectors in the scan test mode. No memory areas are left unfilled as described in the prior art. There are 4M×192 bit data words separated into four 1M sections 502a–502d which allows the sections to operate in parallel in an interleaved manner. In this way the data may be read out four times as fast. For example, parallel test vectors are read simultaneously from sections 502a–502d to Parallel Vector Controller 504. There are 64 three bit parallel test data words in each 192 bit data word sent. Parallel Vector Controller 504 has a buffer 505 holding 32 192×4 (i.e. 768) bit parallel vector data words from memory 500. The parallel test data words are each 3 bits thus providing 8 parallel test vector states per channel. The Parallel Vector Controller 504 provides a 3 bit parallel test data word via bus 523 to each of 64 channel pins ( i.e. could be input, output, or other) 506-1 to 506-64 for channels 508-1 to 508-64 in a DUT 514. Channels 508-1 to 508-64 represent the logic associated with each pin. The pin electronics and timing circuits are represented by 507-1 to 507-64 similar to those of the prior art in FIG. 2.

Scan Controller 512 has a buffer 513 holding 32 192×4 (i.e. 768) scan test vector data words received from memory 500. In addition Scan Controller 512 has 16 Alternate Data Registers 514-1 to 514-16 which store data for scan chains. The number of Alternate Data Bus Registers is selectable by the customer and may be any number up to 16. For example in FIG. 5 five Alternate Data Registers 1–5 are selected to create 5 scan chains. In buffer 513 the data for the 5 scan chains is stored in sections of 15 bits. Each of the 5 scan chain data words is 3 bits. Each of these sections is read into the Alternate Data Registers 1–5 with 3 bits going into each of registers 1–5. After the first 15 bit group is transferred from buffer 513 then the second group of 15 bits is transferred and the process continues until all 15 bit groups in the 768 bit buffer are used up. When buffer 513 has exhausted all of the 15 bit sections it reads in the next succeeding 768 bit word from the 32 words in the buffer. The Alternate Data Registers 1–5 continue to serially pass bits to the respective scan chains. Each of the 3 bit scan test data words has one data bit used at scan in, one expected bit used at scan out, and one mask bit used to mask out unknown data. It is also within the skill of the art to use a 2 bit scan test data word. The mask bit may be left out thus allowing 24 scan chains.

The 15 bits of data in the Alternate Data Registers 1–5 are transferred to 2:1 multiplexer 516 over 15 data lines. There are a total of 48 data lines that may be used for 16 Alternate Data Registers, however, in the given example only 15 are used for the 5 scan chains. The other 33 lines are unused. Multiplexer 516 multiplexes 2 bits per line and thus reduces the total number of lines carrying the scan chain data to the alternate data bus 518 from 48 to 24. There are 24 lines to each channel in alternate data bus 518. This allows bus 518 to carry 8 scan chains (i.e. scan in and a scan out channels for each chain) operating at 50 MHz which is double the speed of a bus operating with 16 chains at 25 MHz. This is one of the features of the invention that makes the transfer of scan test data words fast enough to make the scan testing of large chips economical.

Pattern generator 520 regulates the flow of parallel and scan test vector data words to the Parallel Vector Controller 504 and Scan Controller 512, respectively. The scan test vectors and parallel test vectors are related and must be coordinated when read from memory 500. The relationship occurs because one bit of each 3 bit scan test data word ( i.e. in the Alternate Data Registers) has an expected bit which is used during scan testing to check the expected value of the parallel test vector output. Pattern Processor 520 controls the location and retrieval of both scan and test vectors so that their relationship is maintained. During testing as the parallel test vector data words are depleted in the buffer of Parallel Test Controller 504 it will request more parallel test vector data words. As these words are requested the Scan Controller 512 will also request more related scan test vector data words.

In DUT 514 there may be more than 1,000,000 flipflops (hereinafter ffs—also known as latches or storage elements) 522-1 to 522-n, for example in a Pentium (Trademark of Intel Corporation) processor. The 64 parallel test channels 507-1 to 507-64 will drive the I/O pins for use in parallel testing. Parallel Vector Controller 504 will provide three bit words through bus 518 to most of 64 channels 507-1 to 507-64. Some channels are used for other purposes.

For scan testing the DUT has internal circuitry which connects all of the ffs in series. This is called a scan chain. The 64 channels 507-1 to 507-64 will be used to drive the I/O pins for use in scan testing. For scan testing data the parallel vector (i.e. a switch) provides a signal on one of the input channels 508-1 to 508-64 that will cause the DUT 514 to switch to the scan mode and place all of the ffs in an ff logic chain (i.e. scan vector). This input signal will also be used to return to the parallel state when necessary. Using the example of 5 scan chains from the Alternate Data Registers 1–5, a user can specify which of the 64 channels 508-1 to 508-64 that should receive the scan chains. One channel will be used for the scan bit and a second channel will be used for the scan out bits (i.e. expected bits). In the example 10 channels will be used. For example channel 1, 508-1 shown in FIG. 5 may be selected to receive the first scan chain. Scan in bits will be applied to input 506-1. The third channel 508-3 may be selected to be the scan out channel. Expected bits will be applied to input 506-3. The scan in and scan out arrows shown in FIG. 5 on channels 508-1 and 508-3 are shown only for representational purposes to indicate the switch of the channel to scan testing.

The first step in a scan test is to apply a scan chain through the chain of serial ffs to set up a known state in all of the ffs. The scan in bit will be clocked into gate 522-1 on one cycle thus providing a known state to gate 522-1. The next two clock cycles will clock the bit to gates 522-2 and 522-3 which is also the scan out channel 508-3. This sets all of the serial ffs to a known state. Then all of the ff s are changed from the scan test state to the parallel test state. Next parallel test vectors from parallel vector controller 505 and bus 523 are applied to the inputs of each channel being used for scan testing so the channel inputs are known. The parallel test vector is clocked with one or more cycles through each of the channels which may change the state of each output ff. The ffs are then switched back to the scan test state and a scan chain will cycle out the states of each of the ffs (i.e. the parallel test outputs). The output states will be checked against the expected output bits from the scan test vectors. In the example this channel is 508-3. This provides an indication if the integrated circuit is logically correct. The system programmer sets up the data structure of memory 500 to coordinate the correct expected bits with the related parallel test bits. The ff's are also reset to known states in preparation for the next test. The length of the scan vector will be all serial ffs between channels 1 and 3.

In operation the parallel and scan tests are designed and programmed into the pattern processor 520 prior to testing. A decision is made if the test is to be a parallel test or a scan test. If the test is to be a parallel test then only parallel test vectors are loaded into memory 500 prior to testing taking place. In parallel testing many parallel test vectors are used (i.e. millions) and the entire memory is filled. If the test is to be a scan test then parallel and scan test vectors are loaded into memory 500 prior to testing. In scan testing a small number of parallel test vectors are used (i.e. 100,000). However, a large number of scan test vectors are used, of the order of millions. Since parallel testing and scan testing both require large memories it is possible to use one memory for a tester having a parallel test mode and a scan test mode. Prior art testers having both scan testing and parallel testing use two large memories.

If the test is to be a scan test the IC must be designed to be able to be switched from a parallel operational mode where the logic performs its normal role and the scan testing mode where the ffs form a serial scan chain. The extra circuitry needed for the scan mode is about 15% of the integrated circuit. As stated previously the switching between testing states is done by an input signal to one of the input channels.

The loading procedure takes a significant time for example 20 minutes, but the loading is only done once for a particular integrated circuit type being tested. Thousands of similar circuits are then tested. Once loading is completed and a scan test is selected the test is ready to be started. The pattern processor starts the scan test by having parallel and scan test vectors read from memory 500 into buffer 505 of the parallel vector controller 504 and into buffer 513 of the Scan controller 512.

First an input is provided on the switch channel to switch the ffs to the scan test state. The channels selected to be the scan in and scan out channels for each of the 5 scan chains in the example are enabled. The channels selected to be the scan in and scan out channels will be chosen according to which groups of IC pins are desired to be tested. Initially a scan chain is applied through the chain of serial ffs to set up a known state in all of the ffs. Then the ffs are all switched back to the parallel test state.

The parallel test vector is separated in the parallel vector controller 504 into 64 three bit words which are provided to whichever of the 64 channels 508-1 to 508-64 are being used for the scan test. These channels each contain a portion of the IC logic that is to be tested. The clock in pattern generator 520 will cycle at least one parallel test vector through the logic of each channel. Usually several vectors will be clocked through the logic. At this point there is a new output state for the output ff of each channel. The testing will then be switched back into the scan test state and scan testing will begin.

Buffer 513 will send 15 bit groups to the Alternate Data Bus Registers 514-1 to 514-5. Each Alternate Data Bus Register will represent one scan chain and provide a 3 bit scan test data word for that chain to the multiplexer 516. This will make up a 15 bit word that will be 2:1 multiplexed in multiplexer 516 and put onto bus 518 to be sent to the selected scan in and scan out channels. The scan control 512 will continue to provide scan test input words until the scan chain is completed for each of the selected 5 channels. The parallel test data in the output ff of each channel is rippled out from each of the selected 5 scan out channels. The parallel test output data is then compared to the expected bits from the related scan words. This will indicate whether there is a defect in the logic of the integrated circuit. At the same time the scan chains reset the output ffs with known values for the next test. This may continue for millions of test cycles. Typically a large integrated circuit such as a Pentium processor may take 6–20 seconds to test.

One of the features of the invention is the use of same memory to store all parallel test vectors during the parallel test mode and all scan test vectors and parallel test vectors during the scan test mode. The vectors are packed into the memory to utilize all the space in the memory. It is important to be able to have both modes of testing in one machine because a customer may have parts with the scan circuitry built in for scan testing and other parts with no scan testing circuitry built in. They need a machine that will test both kinds of parts. Using the same memory that will hold large amounts of test vectors for both types of testing makes this possible in a cost efficient manner.

In one embodiment of the prior art two separate memories were used with one for the parallel test mode and one for the scan test mode. In another prior art embodiment one memory was used but was not packed efficiently and large unused spaces were left in the memory. That meant only a limited number of vectors could be placed in the memory.

In addition the speed with which parallel and scan vectors are read out of the memory to the testing circuitry is important to this invention. The testing vectors need to be provided to the testing circuitry at a speed which will allow a chip to be tested quickly. This allows expensive capital equipment to have a fast throughput. To accomplish this the memory is separated into four sections 502a–d which allows interleaving and data may be read out four times as fast. Also because the serial scan chain in a DUT may be very long in a large chip for example 1,000,000 gates this would take many clock cycles to complete. This time is reduced in the invention using a scan controller 512 that is separated into 16 separate Alternate Data Bus Register 514-1 to 514-16 that may operate in parallel and perform the scan tests 16 times faster. The speed is further increased by using 2:1 multiplexer 516 to reduce the number of wires from 48 to 24 going to alternate data bus 518. This allows the bus to run twice as fast at 50 MHz thus reducing run time.

Although the present invention has been described using 64 channels on one board, the test system may be expanded by using multiple boards. For example 16 boards would give 1000 test channels for a very large IC. In addition it is possible that a scan chain be spread over several boards with the scan in channel on one board and the scan out channel on another board.

A second reason for speed is that the customer needs to be able to test at the device speed during parallel testing. The customer may do this by controlling clock speed during parallel testing.

While the preferred embodiments of the invention have been shown and described, numerous variations and alternative embodiments will occur to those skilled in the art. Accordingly, it is intended that the invention be limited only in terms of the appended claims.

We claim:

1. A semiconductor device test system for connecting to and testing an independent integrated circuit device having no connections to other circuits comprising,
   a scan test mode for said device test system,
   a parallel test mode for said device test system,
   a single memory able to use substantially all of its storage space for storing, a) parallel test vectors for use during said parallel test mode, and b) parallel test vectors and scan test vectors for use during said scan test mode,
   a switch for switching between said parallel test mode and said scan test mode,
   a pattern generator coupled to said single memory to manipulate a) said parallel test vectors for use during said parallel test mode to test said integrated circuit and b) said parallel test vectors and scan test vectors for use during said scan test mode to test said integrated circuit.

2. The semiconductor device test system of claim 1 in which said memory is interleaved allowing test vectors to be read out of memory in parallel for use in said parallel and scan test modes.

3. The semiconductor device test system of claims 1 or 2 having a scan controller with a scan control buffer for receiving said scan test vectors for use during said scan test mode from said memory, said scan controller further having one or more alternate data bus registers each receiving data words serially from said scan control buffer thus forming a serial chain of data words which form a scan chain.

4. The semiconductor device test system of claim 3 in which said serial data words contain a scan in bit used at scan in, and an expected bit used at scan out.

5. The semiconductor device test system of claim 4 in which said serial data words further contains a mask bit used to mask out unknown data.

6. The semiconductor device test system of claim 4 having a multiplexer cooperating with said alternate data registers over one or more communication lines, said multiplexer receiving said serial chain of data words over said communication lines, said multiplexer multiplexing said data words and providing said multiplexed words to an alternate data bus over a reduced number of lines, thus allowing said alternate data bus to run at an increased data rate.

7. The semiconductor device test system of claim 6 having a device under test with multiple pins, substantially all of said pins being separate channels in said device under test, one or more of said pins connected to said alternate data bus through one or more channel inputs, each said scan chain cooperating with one or more of said channels.

8. The semiconductor device test system of claim 7 in which one or more channels are selected to each receive one of said scan chains, said channels being scan in channels and receiving only the scan in bits from the data words of said scan chains, and in which one or more other channels are selected to each receive the scan out expected bits from the data words of one of said scan chains.

9. The semiconductor device test system of claim 8 having a parallel vector processor with a buffer for receiving said parallel test vectors from said memory for use during said parallel test mode.

10. A semiconductor device test system for connecting to and testing an independent integrated circuit having no connections to other circuits comprising,
    a scan test mode for said device test system,
    a parallel test mode for said device test system,
    a single memory able to use substantially all of its storage space for storing, a) parallel test vectors for use during said parallel test mode, and b) parallel test vectors and scan test vectors for use during said scan test mode, said memory being interleaved to allow test vectors to be read out of memory in parallel,
    a scan controller with a scan control buffer for receiving said scan test vectors for use during said scan test mode from said memory, said scan controller further having one or more alternate data registers each receiving data words serially from said scan control buffer thus forming a serial chain of data words which form a scan chain,
    a parallel vector controller with a buffer for receiving said parallel test vectors from said memory for use during said parallel test mode and said scan test mode,
    said serial data words contain a scan in bit used at scan in, an expected bit used at scan out, and a mask bit used to mask out unknown data,
    a switch for switching between said parallel test mode and said scan test mode, a pattern generator coupled to said single memory to manipulate a) said parallel test vectors for use during said parallel test mode to test said integrated circuit and b) said parallel test vectors and scan test vectors for use during said scan test mode to test said integrated circuit.

11. The semiconductor device test system of claim 10 having a device under test with multiple pins, substantially all of said pins being separate channels in said device under test, one or more of said pins cooperating with said alternate data registers through one or more channel inputs, each said scan chain cooperating with one or more of said channels.

12. The semiconductor device test system of claim 11 in which one or more channels are selected to each receive one of said scan chains, said channels being scan in channels and receiving only the scan in bits from the data words of said scan chains, and in which one or more other channels are selected to each receive the scan out expected bits from the data words of one of said scan chains.

13. The semiconductor device test system of claim 12 having a multiplexer cooperating with said alternate data registers over one or more communication lines, said multiplexer receiving said serial chain of data words over said communication lines, said multiplexer multiplexing said data words and providing said multiplexed words to an alternate data bus over a reduced number of lines, thus allowing said alternate data bus to run at an increased clock speed.

14. A device test system for connecting to and scan testing semiconductors having no connections to other circuits comprising, a single memory able to use substantially all of its storage space for storing parallel test vectors and scan test vectors for use during said scan testing, a pattern generator coupled to said single memory to manipulate said parallel test vectors and scan test vectors for use during said scan test mode to test said semiconductors, a scan controller with a scan control buffer for receiving said scan test vectors for use during said scan test mode from said memory, said scan controller further having one or more alternate data registers each receiving data words serially from said scan control buffer thus forming a serial chain of data words which form a scan chain, a parallel vector controller with a buffer for receiving said parallel test vectors from said memory for use during said scan test mode, said serial data words contain a scan in bit used at scan in, and an expected bit used at scan out.

15. The semiconductor device test system of claim 14 having a device under test with multiple pins, substantially all of said pins being separate channels in said device under test, one or more of said pins cooperating with said alternate data registers through one or more channel inputs, each said scan chain cooperating with one or more of said channels.

16. The semiconductor device test system of claim 15 in which one or more channels are selected to each receive one of said scan chains, said channels being scan in channels and receiving only the scan in bits from the data words of said scan chains, and in which one or more other channels are selected to each receive the scan out expected bits from the data words of one of said scan chains.

17. The semiconductor device test system of claim 16 having a multiplexer cooperating with said alternate data registers over one or more communication lines, said multiplexer receiving said serial chain of data words over said communication lines, said multiplexer multiplexing said data words and providing said multiplexed words to an alternate data bus over a reduced number of lines, thus allowing said alternate data bus to run at an increased clock speed.

18. The semiconductor device test system of claim 17 in which said memory is interleaved allowing test vectors to be read out of memory in parallel for use in said scan test mode.

19. The semiconductor device test system of claim 18 in which said serial data words further contain a mask bit used to mask out unknown data.

* * * * *

UNITED STATES PATENT AND TRADEMARK OFFICE
CERTIFICATE OF CORRECTION

PATENT NO. : 6,049,901
DATED : April 11, 2000
INVENTOR(S) : Mary C. Stock, et al.

It is certified that error appears in the above-identified patent and that said Letters Patent is hereby corrected as shown below:

On the Title page, item (76) Inventors, insert
--William H. McCandless, 46 Hemlock Hill Rd.,
Carlisle, Mass. 01741--.

Signed and Sealed this

Thirteenth Day of February, 2001

Attest:

NICHOLAS P. GODICI

Attesting Officer    Acting Director of the United States Patent and Trademark Office